(12) United States Patent
Puma et al.

(10) Patent No.: US 7,492,295 B2
(45) Date of Patent: Feb. 17, 2009

(54) SELF-ADAPTING TRACKING ANALOGUE-TO-DIGITAL CONVERTER AND RF TRANSMITTER

(75) Inventors: Giuseppe Li Puma, Bochum (DE); Michael Feltgen, Krefeld (DE); Christian Vieth, Neukirchen-Vluyn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/743,429

(22) Filed: May 2, 2007

(65) Prior Publication Data

US 2008/0272951 A1    Nov. 6, 2008

(51) Int. Cl.
*H03M 1/62* (2006.01)
(52) U.S. Cl. .................................. 341/139; 341/155

(58) Field of Classification Search .............. 341/131, 341/139, 156
See application file for complete search history.

(56) References Cited

U.S. PATENT DOCUMENTS

| | | | | |
|---|---|---|---|---|
| 5,101,206 A | * | 3/1992 | Riedel | 341/156 |
| 5,231,398 A | * | 7/1993 | Topper | 341/156 |
| 5,568,143 A | * | 10/1996 | Hutchison et al. | 341/139 |
| 7,176,819 B1 | * | 2/2007 | Swerlein et al. | 341/143 |

* cited by examiner

*Primary Examiner*—Brian Young
(74) *Attorney, Agent, or Firm*—Eschweiler & Associates, LLC (57) ABSTRACT

A self-adapting analogue-to-digital converter includes a forward path with a voltage divider coupled to a digital integrator. In a feedback path, a scaler is connected to a digital-to-analogue converter. A control unit provides control signals for the voltage divider and the scaler in response to the output word of the digital integrator.

36 Claims, 9 Drawing Sheets

|       | active 8 bits |                                    |
|-------|---------------|------------------------------------|
| y(k) R1 | 0000 0000 000 |                                  |
| R2    | 0000 0000 001 |                                    |
| R3    | 0000 0000 010 |                                    |
| R4    | 0000 0000 011 |                                    |
|       | . . .         |                                    |
| R5    | 0000 1111 011 | ←Threshold                         |
| R6    | 0000 1111 011 | ←switch voltage divider and bitshift |
| R7    | 0000 1110 101 | ← neglacted bit                    |
| R8    | 0000 1111 111 |                                    |
| R9    | 0001 0000 001 |                                    |
|       | . . .         |                                    |
| R10   | 0001 1110 111 | ←Threshold                         |
| R11   | 0001 1110 111 | ←switch voltage divider and bitshift |

SELF-ADAPTING TRACKING ANALOGUE-TO-DIGITAL CONVERTER AND RF TRANSMITTER

FIELD OF INVENTION

The invention relates to a self-adapting tracking analogue-to-digital converter and to a transmitter including a power control loop with such converter.

BACKGROUND

Analog-to-digital converters have become of higher importance in the last years due to the variety of different applications in which they are used. An analogue-to-digital converter converts an analogue input signal into a digital value, wherein the digital value has a specific resolution. Based on the application, the dynamic range of the analogue-to-digital converter as well as the required resolution may vary.

BRIEF DESCRIPTION OF THE DRAWINGS

The invention is explained in detail below using exemplary embodiments with reference to the drawings in which.

DETAILED DESCRIPTION OF THE INVENTION

In the following description, further aspects and embodiments of the invention are disclosed. In addition, reference is made to the accompanying drawings which form a part hereof, and which shows by way of illustration various examples in which the invention may be practiced. The embodiments of the drawings present a discussion in order to provide a better understanding of one or more aspects of the present invention. The disclosure is not intended to limit the feature or key elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes can be applied without departing from the scope of the invention. The elements of the drawings are not necessarily to scale relative to each other. For illustration purposes, some elements in the drawings may comprise a short description of their functionality. This description is not intended to limit the specific element to the named functionality. Rather it describes one possible function despite others. Further, some frequency ranges and communication standards are specified. The ranges as well as the communication standards are not restricted to the embodiments disclosed herein. Other frequency and power ranges or communication standards can also be applied to achieve different aspects of the present invention. Like reference numerals designate corresponding similar parts.

Figure 1:
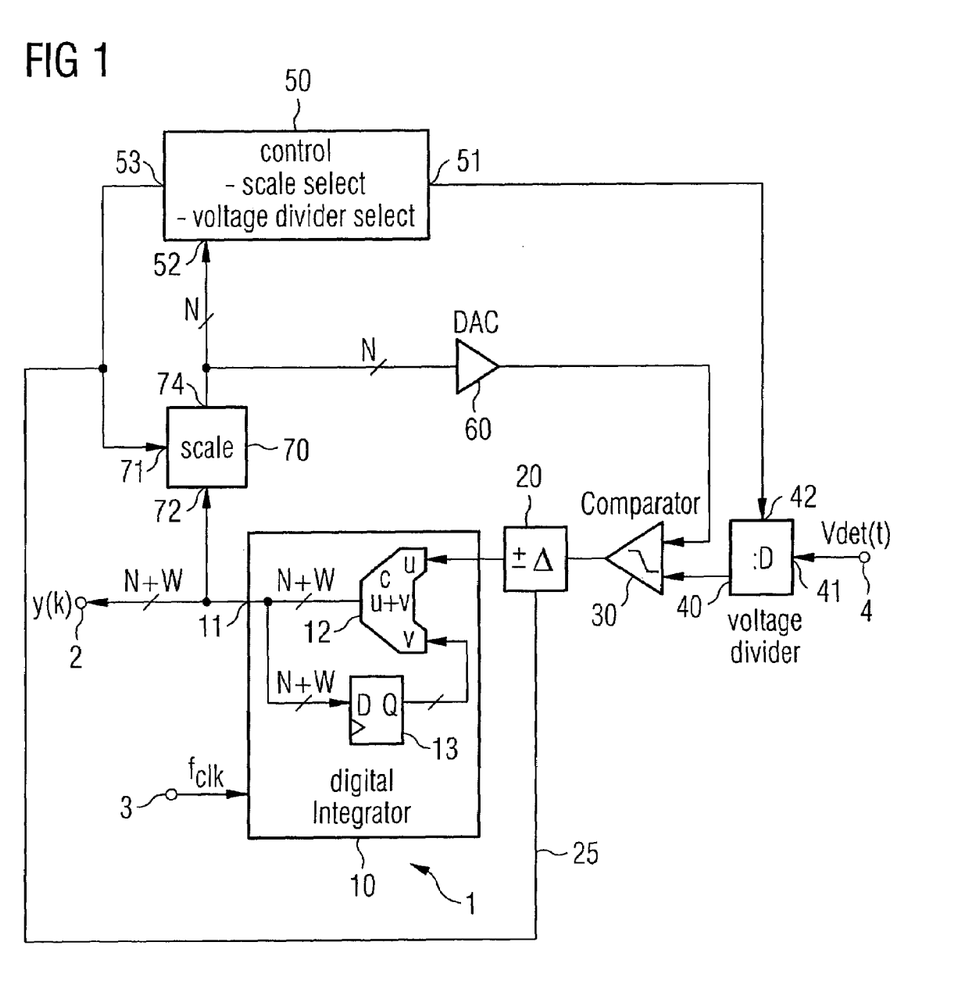
FIG. 1 illustrates a first embodiment of a self-adapting tracking analogue-to-digital converter.

FIG. 1 illustrates an embodiment of a self-adapting tracking analogue-to-digital converter 1 capable of covering a wide dynamic power range for input signals. The analogue-to-digital converter 1 comprises an input signal terminal 4, on which an analogue input signal Vdet(t) can be applied. The terminal 4 is connected to a controllable voltage divider 40 dividing the input voltage of the analogue signal Vdet(t) by a ratio selectable via a control signal at terminal 42.

The output of the voltage divider 40 is applied to a comparator 30, that compares the divided signal with a reference signal provided by a digital-to-analogue converter 60 in a feedback path. The following compensator block 20 may comprise a selectable step tracking behavior, thereby selecting various step widths for compensating the voltage division of the divider 40. For instance the step width, selected by the compensator block 20 is adjusted to the voltage divisor of divider 40. With the selectable step width of block 20, the self-adapting analogue-to-digital converter 1 can be switched between a fast tracking mode for low resolution and a very sensitive tracking mode for high resolution. The control input terminal 25 of the step compensator block 20 is coupled to control circuit 50 at terminal 53. The digital integrator 10 comprises an adding circuit 12 with a first input terminal connected to the output of block 20. A second input terminal v is adapted to receive a data word provided by a buffer 13. The buffer 13 comprises one or a plurality of flip flops, each having a data output Q, a data input D, and a reference clock signal input. At the data outputs Q, a single bit of the data word is provided by the flip flops with each clock of the clock signal $f_{clk}$ at terminal 3. The data input of the buffer 13 is connected to the data output of the adding circuit 12.

The adding circuit 12 provides the sum of the digital words at the input terminals u and v, respectively, at the output terminal 11 of the digital integrator. The data word is also applied to the data input of the buffer unit 13.

The output terminal 11 of the digital integrator 10 is coupled to output 2 to provide a digital data word y(k). The data word has a length of N+W bits, wherein N corresponds to the first N significant bits and W to the remaining bits of data word y(k). The output terminal 11 of the digital integrator 10 is also connected to a selectable scaler or scaling unit 70. The control input 71 of the scaler 70 is coupled to a terminal 53 of a control circuit 50, which provides a scale selection signal in response to the first N bits of y(k) at input terminal 52. This scale selection signal is also applied to the step compensator block 20. The output terminal 74 of scaler 70 is connected to the input terminal 52 of the control circuit as well as to an input terminal of the digital-to-analogue converter 60.

In operation of the self-adapting tracking analogue-to-digital converter, an analogue voltage signal Vdet(t) is applied at terminal 4. The analogue voltage signal is divided by the voltage divider 40 and applied to a first input of the comparator 30. The comparator 30 provides a result signal corresponding to the difference of the signals applied to both input terminals. The result is multiplied by a specific factor in step compensation block 20 determined by the selection signal of control logic 50. For instance, if the voltage by the divider is divided by the factor of two, the step compensator block 20 multiplies the comparator's 30 output result by the same factor, resulting in a step width of two. In other words, the multiplication factor used in the compensator 20 may be the reciprocal value of the divisional factor of the divider 40. While this may reduce resolution in the digital integrator, the overall speed of the arrangement is maintained. Consequently, the step width Δ is chosen by a proper selection at terminal 25 of block 20 and used to switch the analogue-to-digital converter 1 to a fast tracking mode or a mode with high resolution.

The output of the digital integrator 10 is applied to terminal 72 of scaler 70. The scaler 70 rescales the data word and provides an output data word with less bit length compared to the input data word y(k). For example, if the data word provided at terminal 11 of the digital integrator 10 comprises a bit length of n+w, the scaler 70 uses only n bits of the input data word. The scaled output data word is applied to a control unit 50 and to the digital-to-analogue converter 60.

For slow varying input signals, the converter is able to track the analogue input signal Vdet(t). If the analogue input signal is very small, the voltage divider ratio D is set to a low value, for example to divider ratio 1. Accordingly, the analogue signal Vdet(t) is not divided but applied to the input terminal of comparator 30 directly. The result of the comparator's output signal is directly applied to the integrator 10 and summed up within the digital integrator. As soon as the analogue input voltage increases and reached a certain level indicated by an increasing data word y(k), the voltage divider ratio D of divider 40 can be increased. The switching of the voltage divider ratio is controlled by the analogue-to-digital converter 1 itself in a self-adapting manner. For this purpose, the control block 50 tracks the first N least significant bits provided by the scaler 70 which is derived from the output data word y(k) of the digital integrator 10. As soon as the data word increases above a predefined threshold value, the control circuit 50 provides a first control signal at terminal 51 to select a different divider ratio. A second control word is provided at terminal 53 to contemporarily select a new scaling ratio for scaler 70 and step compensator block 20 in order to keep the data output y(k) instantaneously unaffected.

If the analogue voltage signal decreases, the corresponding digital output word y(k) and the scaled data word N decrease as well. When the digital comparison of the data word N with a corresponding threshold value in the control circuit 50 indicates a drop below the threshold value, the control circuit 50 provides control signals switching the voltage divider 40 to a higher ratio and changing the scaling factor of scaler 70 and block 20 by the same factor.

As a result, the analogue-to-digital converter is dynamically switching between different resolution modes when measuring increasing or decreasing analogue signals, for example during a power ramp-up or a power ramp-down, thereby leading to a self-adapting tracking capability. The scaled data word N, which corresponds to the first N significant bits of the output data word y(k), allows the implementation of a very fast digital-to-analogue converter 60 without decreasing the overall resolution. In particular, an analogue-to-digital converter with a high resolution for a high dynamic range is realized with the voltage divider 40, the compensator block 20 and the scaler 70. If the voltage of the analogue signal at the voltage divider increases, the analogue-to-digital converter dynamically switches to a lower resolution mode. In case of decreasing voltage of the analogue input signal, the analogue-to-digital converter switches adaptively by the self-adjusting control mechanism to a higher resolution. The self-adapting analogue-to-digital converter enables the design of various applications with a minimum amount of silicon area.

Figure 2:
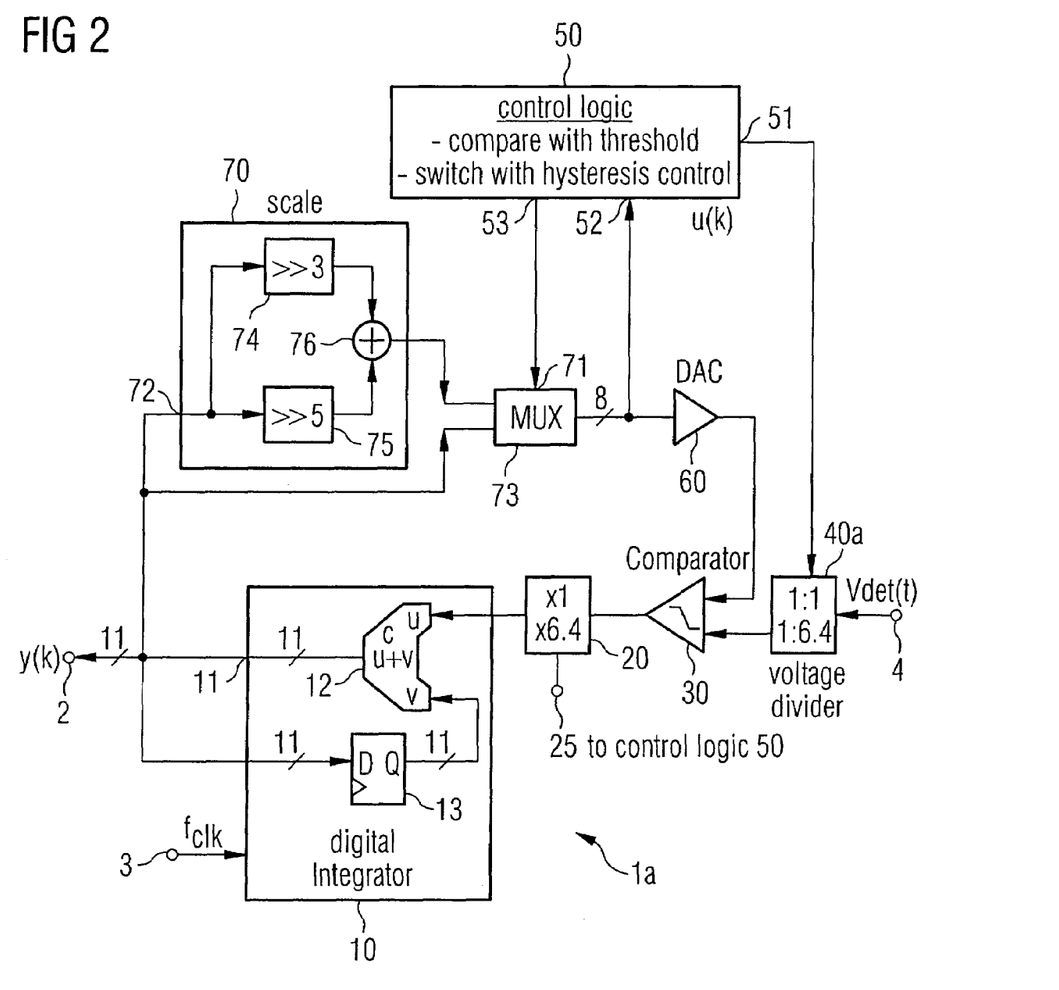
FIG. 2 illustrates a second embodiment of a self-adapting tracking analogue-to-digital converter.

FIG. 2 illustrates a further embodiment of a self-adapting fast tracking analogue-to-digital converter. The embodiment may be used, for example, in a power control loop for a transmitter or a receiver arrangement in mobile communication devices. The analogue-to-digital converter can also be used in other consumer products like, for example, computer systems, mp3 players, DVD or CD players and the like. In this exemplary embodiment, an 8 bit digital-to-analogue converter 60 is used. The voltage divider 40a comprises a selectable resistive divider with a selection of the divider ratio of 1:1 and 1:6.4. Depending on the output voltage of the digital-to-analogue converter, the resolution may be in the range of some mV in case the voltage divider is switched to 1:1 divider ratio. A lower resolution mode with the ratio 1:6.4 selected may be sufficient for analogue input signals Vdet(t) with higher power levels. The resolution decreases by the factor 6.4 in the low resolution mode.

The voltage divider ratio of 1:6.4 is equivalent to the sum of $1/8+1/32$. The ratio can be easily realized in the digital domain using the scaler 70 comprising two bit shifters 74 and 75. The digital output word y(k) comprises a bit length of 11 bits and is provided at terminal 72 connected to the bit shifters 74 and 75. The bit shifter 74 shifts the data word at its input by three bits, thereby neglecting the first three significant bits. Consequently, the output of the bit shifter 74 provides a data word with y(k) divided by 8. The second bit shifter 75 shifts the input data word y(k) by five bits and provides an 11 bit signal at its output. Both signals are summed up in the device 76 and provided at an input of a multiplexer unit 73 which will only use the 8 least significant bits.

A second input terminal of the multiplexer unit 73 is connected directly to terminal 11 of the digital integrator 10. The multiplexer unit 73 is controlled by a corresponding control signal at input terminal 71 provided by the control logic 50. The output of the multiplexer unit 73 provides an 8 bit word u(k), which is applied to the digital-to-analogue converter 60 and to the control logic 50.

In operation, the control logic 50 compares the data word u(k) with several threshold values. If the analogue input voltage Vdet(t) at terminal 4 increases, the digital data word y(k) at the output of digital integrator 10 increases correspondingly. At some instance, the control logic 50 switches the multiplexer 73 to the second input terminal, receiving the output data word of the scaler 70. At the same time, the divider ratio of the voltage divider 40a is switched to the ratio 1:6.4. The multiplication factor in step compensation block 20 is set to 6.4 as well. This will keep the overall processing speed of the arrangement substantially constant. Due to the scaled factor by scaler 70, the data word y(k) is bit shifted by the same factor 6.4. Consequently, the converter 60 outputs an analog signal, which is reduced by the factor of 6.4 as well.

The switching between the high resolution and the low resolution mode is accomplished dynamically during the increase or decrease of the analogue input signal in response to the comparison result with the threshold values. The switching may be realized between two successive clock edges of the clock signal $f_{clk}$ at terminal 3 of the digital integrator. This procedure may reduce distortion effects of the output data word y(k) due to the switching event.

The control logic 50 also comprises additional threshold values which are used to implement a hysteresis curve in one embodiment. The hysteresis curve is used to prevent the control logic from switching back due to distortion effects or variations on the data word y(k) or the analogue input signal. The additional threshold values used for the hysteresis curve take into account the selected divider ratio.

Figure 3:
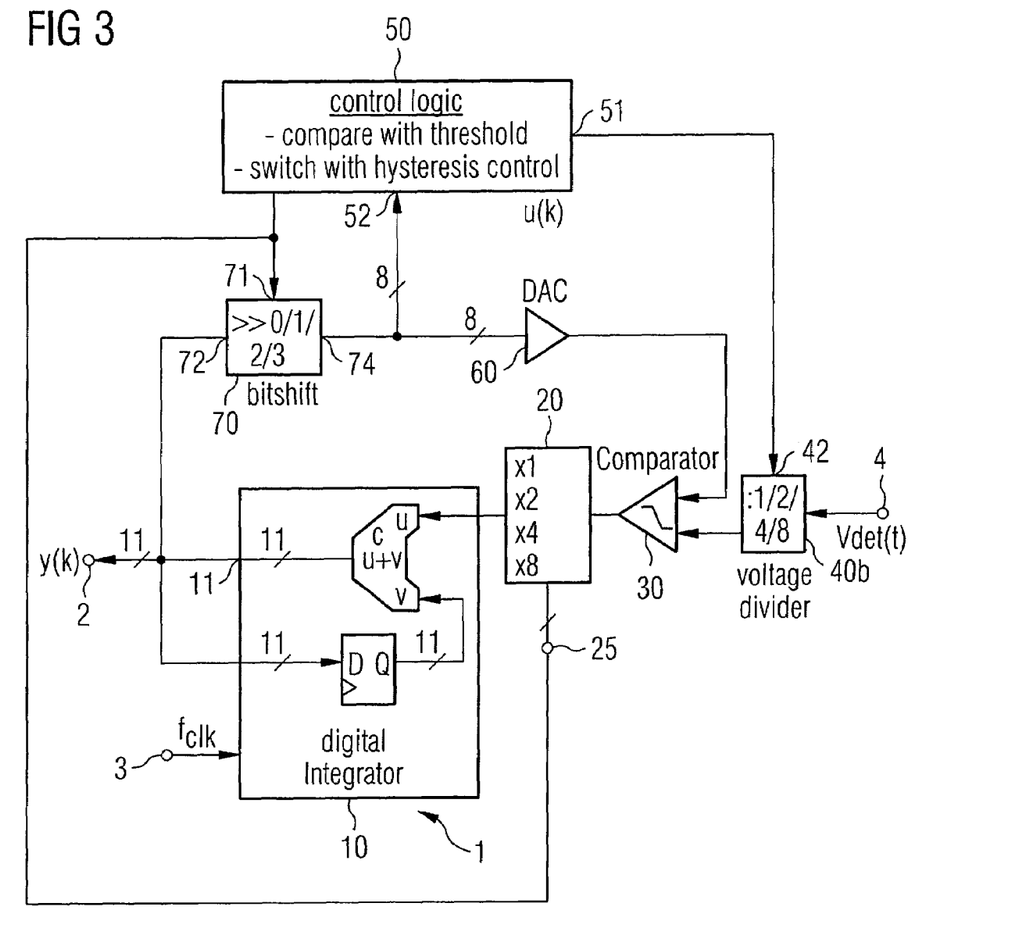
FIG. 3 illustrates a third embodiment of a self-adapting tracking analogue-to-digital converter.

FIG. 3 illustrates a further embodiment of a self-adapting fast tracking analogue-to-digital converter with at least four operating modes. The divider ratio of the voltage divider 40b can be selected between four different values given by $2^{-i}$ with i=0, 1, 2, 3. Consequently, in response to the control signal at terminal 42, the voltage divider 40b divides the input voltage of analogue signal Vdet(t) by a factor of 1, 2, 4 or 8. The bit shifter 74 shifts the 11 bit data word y(k) by 0, 1, 2 or 3 bits in response to a control signal provided by the control logic 50 at terminal 71. In addition the step compensator block 20 provides different multiplication factors of 1, 2, 4 and 8 in response to the control signal of the control logic.

The 8 bit data word u(k) is derived from the data word y(k) directly, by extracting the corresponding 8 bits. For example, the 8 bit data word u(k) corresponds to the first eight least significant bits of the output data word y(k) in the "0-adjustment" of the bit shifter 70. If the analogue-to-digital converter 1 is set to the lowest resolution mode by the control logic 50, the voltage divider 40b divides an input voltage by the factor of 8 and provides the divided voltage at the input terminal of comparator 30. In this position, the bit shifter provides the data word u(k) corresponding to the first eight most significant bits of the output data word y(k). In addition, the step compensator block 20 multiplies the comparator's output results by the same factor.

Figure 4:
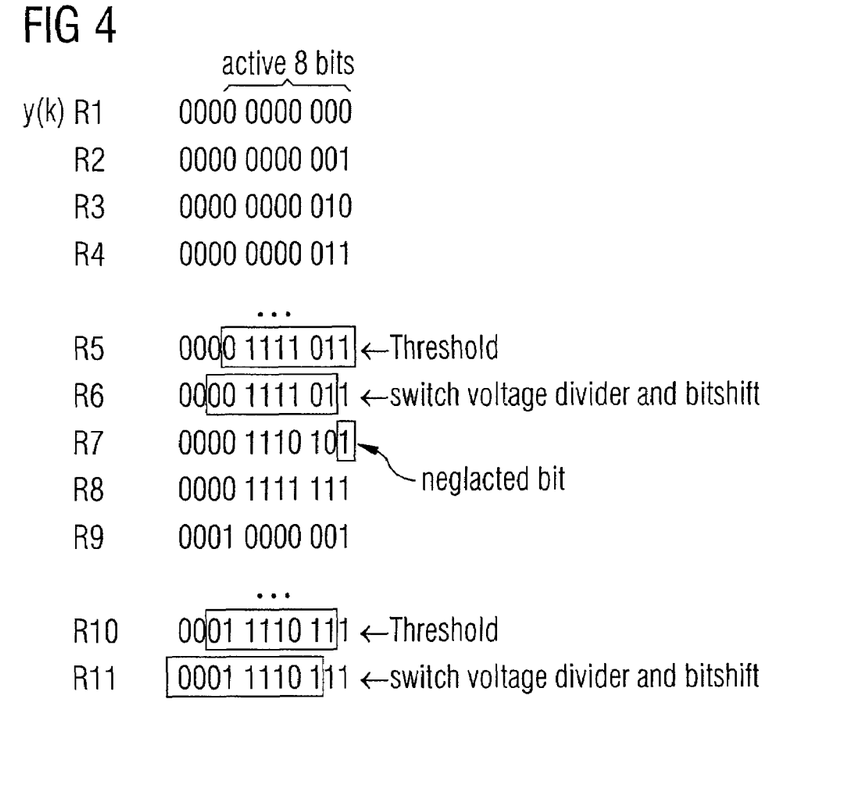
FIG. 4 shows an exemplary illustration of a data output during an increasing input signal.

FIG. 4 shows some example of the output data word y(k) illustrating the threshold and the data word value in which the voltage divider and bit shifter is switched to the next resolution. The output y(k) is illustrated for different output cycles of an increasing input signal Vdet(t). The active eight bits applied to the digital-to-analogue converter 60 correspond to the eight least significant bits [00000000] in rows R1 to R4.

The data word u(k) corresponding to the threshold value can be seen in row R5. The increasing voltage initializes a switch of the voltage divider to the next resolution and a bit shift of the data word u(k) provided to the digital-to-analogue converter by one bit. This can be seen in row R6 wherein the least significant bit on the right side is neglected. The data word u(k) provided to the digital-to-analogue converter 60 now comprises the value [00111101]. The least significant bit is completely neglected for the next four rows R7 to R10. The next threshold value in row R10 corresponds to the data word u(k)=[01111011]. If the analogue input signal is still increasing, the data word y(k) will be left shifted by one bit again, thereby switching to the next lower resolution as seen in row R11. The voltage divider is selected to a dividing ratio of 1:4.

If the analogue input signal decreases, the control logic switches the bit shifter to the next lower value, resulting in a right bit shift of one bit. Accordingly, the voltage divider ratio is selected to the next lower level.

Figure 5:
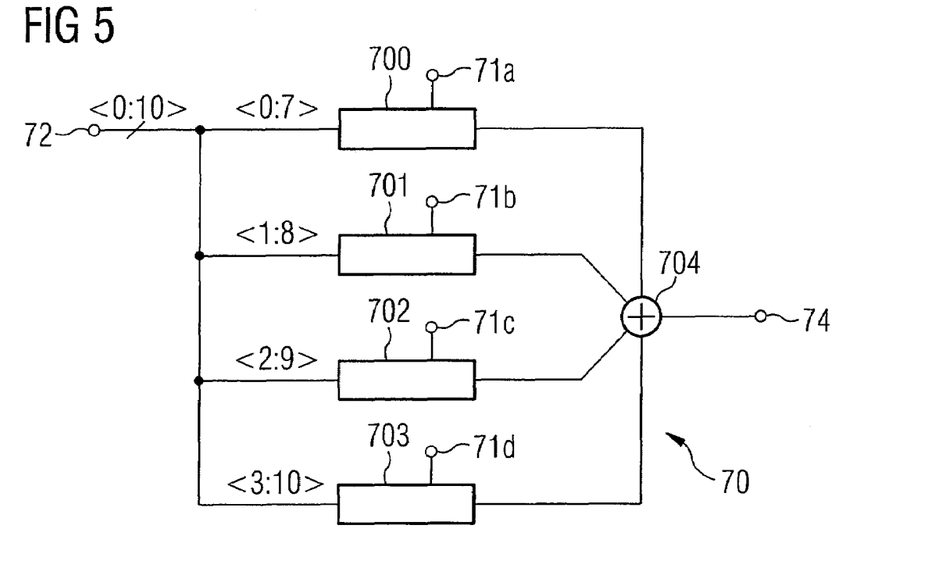
FIG. 5 illustrates an embodiment of a scaling unit used in an embodiment of a self-adapting tracking analogue-to-digital converter.

FIG. 5 illustrates a possible embodiment for a bit shifter as seen in the embodiment according to FIG. 3. The bit shifter 70 comprises four buffers 700 to 703 having an eight bit length with their input terminals connected to terminal 72. In the first register 700, the first eight least significant bits are buffered. Consequently, in the following registers 700 to 703, the next eight successive bits can be buffered. The output of the registers 700 to 703 are connected to an output terminal 74 via a multiplexer 704. The multiplexer selects one of the registers and provides the corresponding register content at its output terminal.

Each of the registers comprises a selection terminal 71a to 71d, respectively. The selection terminals are connected to the corresponding control logic. In response to a selection signal, one of the registers provides the data word at its input at output terminal 74. Of course, other possibilities of bit shifters or scaler units can be used as well. For instance, multipliers or dividers dividing the data word by the corresponding voltage divider ratio can be used as well. If the voltage divider ratio is set to a factor of ½, a divider in the scaler unit 70 has to be set to the same factor, thereby dividing the data word y(k) by a factor of 2.

Figure 6:
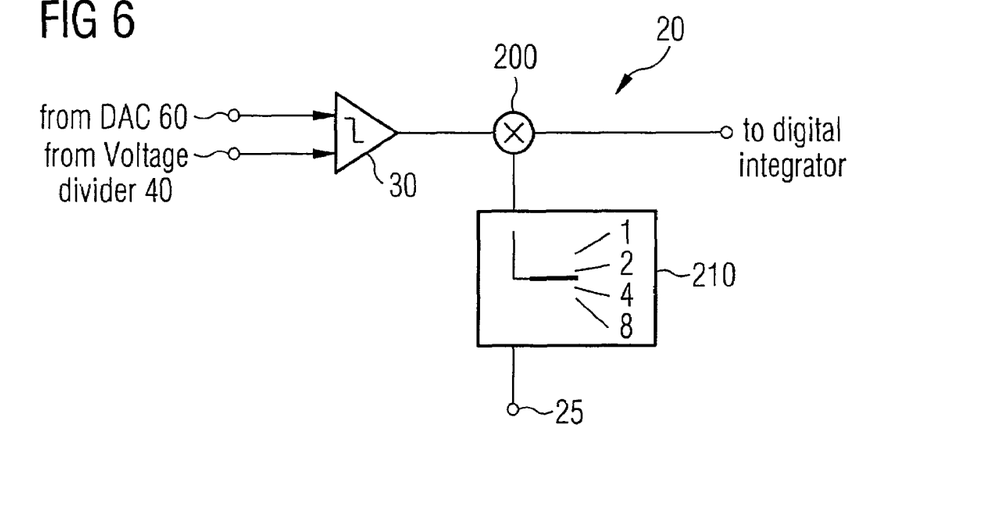
FIG. 6 shows an embodiment of a comparator and a step compensator connected thereto.

FIG. 6 shows an embodiment of a step compensator block 20 with a selectable compensation parameter. The compensation parameters are used to set the step width for the digital integrator 10, thereby keeping the integration in each step in accordance with the division factor of the voltage divider 40. If, for instance, the voltage divider is set to a divisional factor of N, a voltage increase or decrease is divided by this factor. To reproduce the voltage change, the increase or decrease has to be provided to the digital integrator 10. Therefore, the step compensator block 20 multiplies the comparator's output value by the same factor.

In this embodiment, the step compensator block 20 comprises a multiplier unit 200 with a first input coupled to the comparator's 30 output. A second input of the multiplier 200 is connected to a multiplexer unit 210. The multiplexer 210 selects one of the multiplication values and applies the value to the multiplier 200 in response to the control signal at terminal 25. In this embodiment, the values 1, 2 4 and 8 are fixed and may be stored in registers of the multiplexer. Of course other values can be used as well, for instance 1 and 6.4 as mentioned in the embodiment according to FIG. 2. The multiplier multiplies the values +1, −1 provided by the comparator by the multiplication factor, thereby changing the step width. The result is applied to the digital integrator 10.

Figure 7:
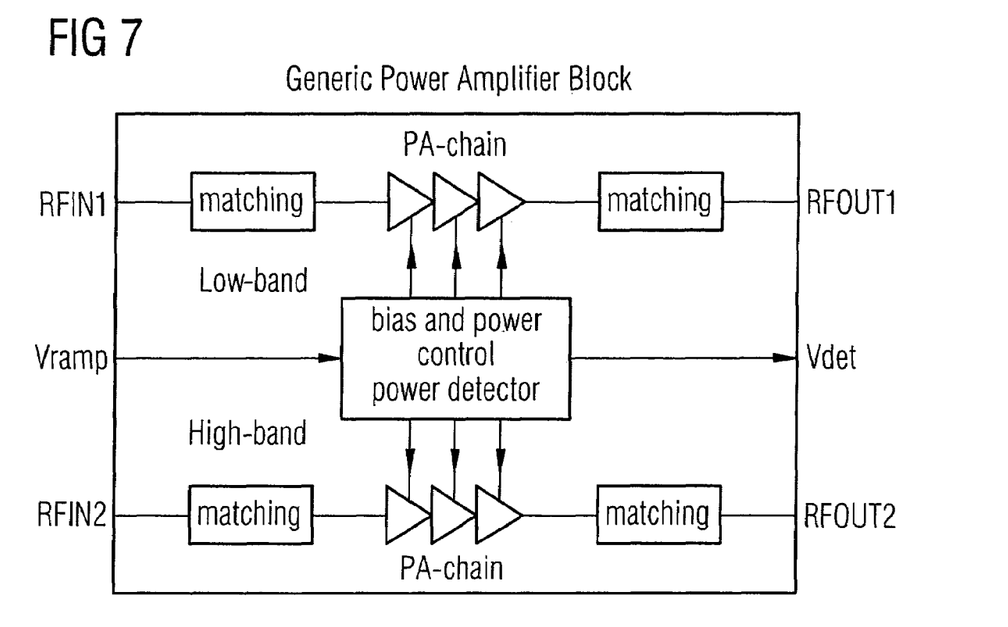
FIG. 7 illustrates a generic transmitter and power amplifier block diagram for different RF signals.

FIG. 7 illustrates a generic power amplifier block according to one embodiment. The amplifier block may comprise one, two or a plurality of amplifier signal paths, each of them comprising a power amplifier chain with a matching network connected upstream and downstream. The matching network as well as the power amplifier chain of the signal amplifier paths can be optimized for a specific frequency and/or power range. In this embodiment, the first amplifier signal path is adapted to amplifier RF signals within a low-band frequency range. The second amplifier signal path amplifies an RF signal RFIN2 within a high-band frequency range.

Both amplifier signal paths may comprise one or more power amplifiers with variable and selectable amplification gain. For this purpose, the power amplifier comprises a gain control input, which is connected to a bias and power control circuit block. In addition, a power detector, which is not shown here for illustration purposes, is arranged within the last amplifier signal path to measure and determine the output power of the corresponding signal paths. The measured power is provided as analogue signal Vdet. The control unit selects the proper amplification gain in the respective power amplifiers in response to an external control signal Vramp. This signal may be used for instance to generate a power ramp-up or a power ramp down function if pulsed signals are to be transmitted. In addition, the control unit is able to switch off the corresponding amplifier signal paths by, for instance, biasing the respective power amplifiers.

Output power control for handset devices has become of higher importance in the last years. An optimal efficiency with respect to output power shall be obtained to enable an efficient traffic load in the cellular networks, thereby increasing the number of users per cell. The requirements of a strict specific output power require an automatic power control loop in the transmitter solutions for the handheld devices. To control the radiated output power at the antenna, often a bi-directional coupler is used measuring the incident and the reflected wave. The coupler provides a portion of the incident wave to a detector enabling the control loop to adjust the output power.

In addition, some mobile telecommunication standards require a time division duplex transmission mode, generating pulsed signals for data transmission. Such telecommunication standards may include, for example, the GSM, or EDGE standard as well as the third generation communication standard wideband CDMA/TDD. However, the power-up and power-down ramping during data transmission of pulsed signals may generate spurious portions in adjacent channels. Consequently, the power control loops do not only control the output power during data transmission but also the power ramping at the beginning and the end of the pulsed transmission.

Figure 8:
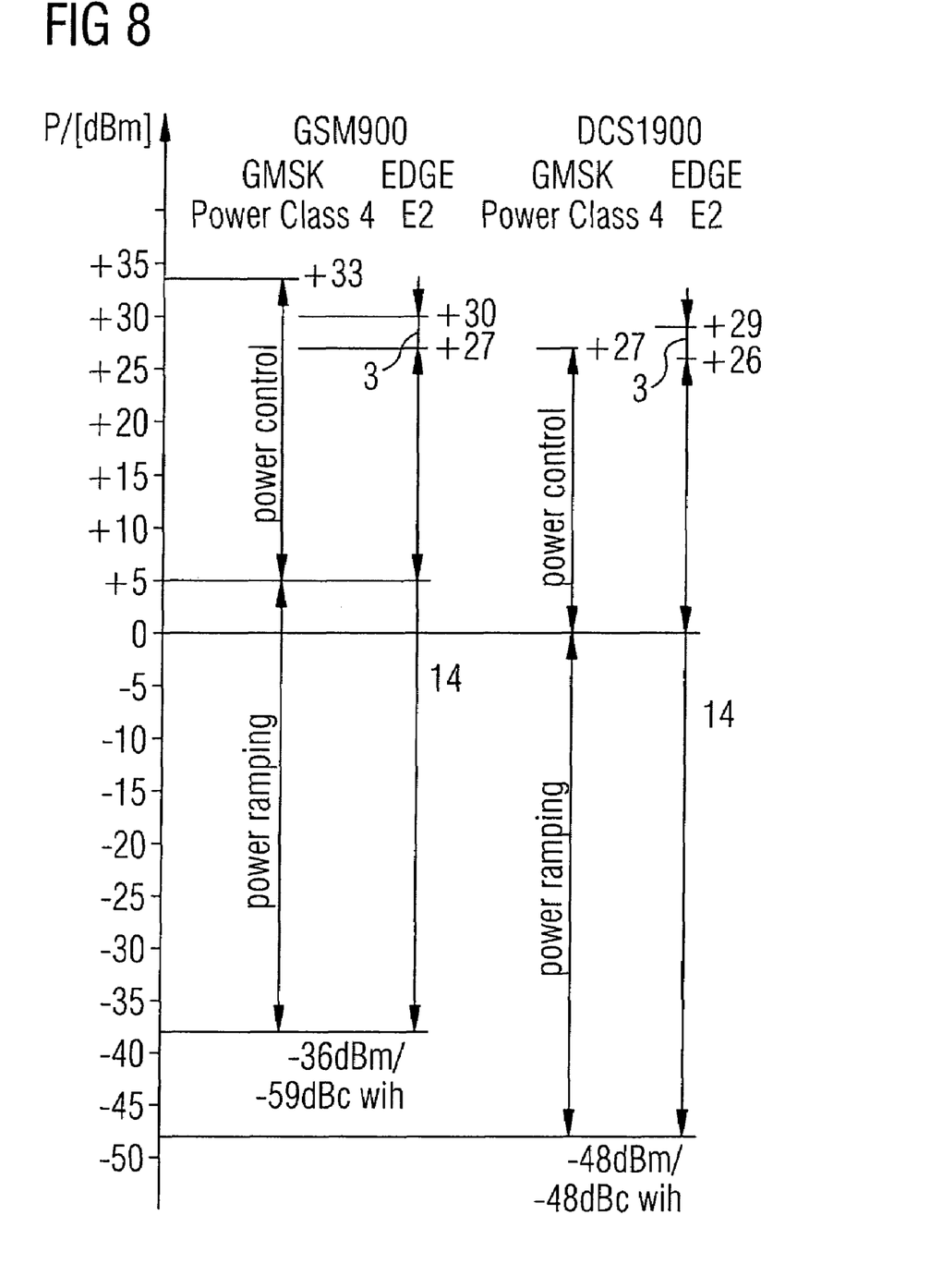
FIG. 8 shows a power range diagram of signals according to the GSM and EDGE mobile communication standards.

FIG. 8 gives an overview about the dynamic range for the telecommunication standards GSM and EDGE within the low-band frequency of GSM900 at roughly 900 MHz and the high-band frequency DCS1900 at 1.9 GHz. While the mobile communication standards GSM and EDGE comprise different power levels during data transmission ranging from +5 to +33 dBm in the low frequency band, power control in the high frequency band ranges from 0 dBm to +30 dBm. Nevertheless, the power control loop must also take into account the dynamic range for the power ramping. As a result, the total required dynamic range is approximately 46 dB.

Figure 9:
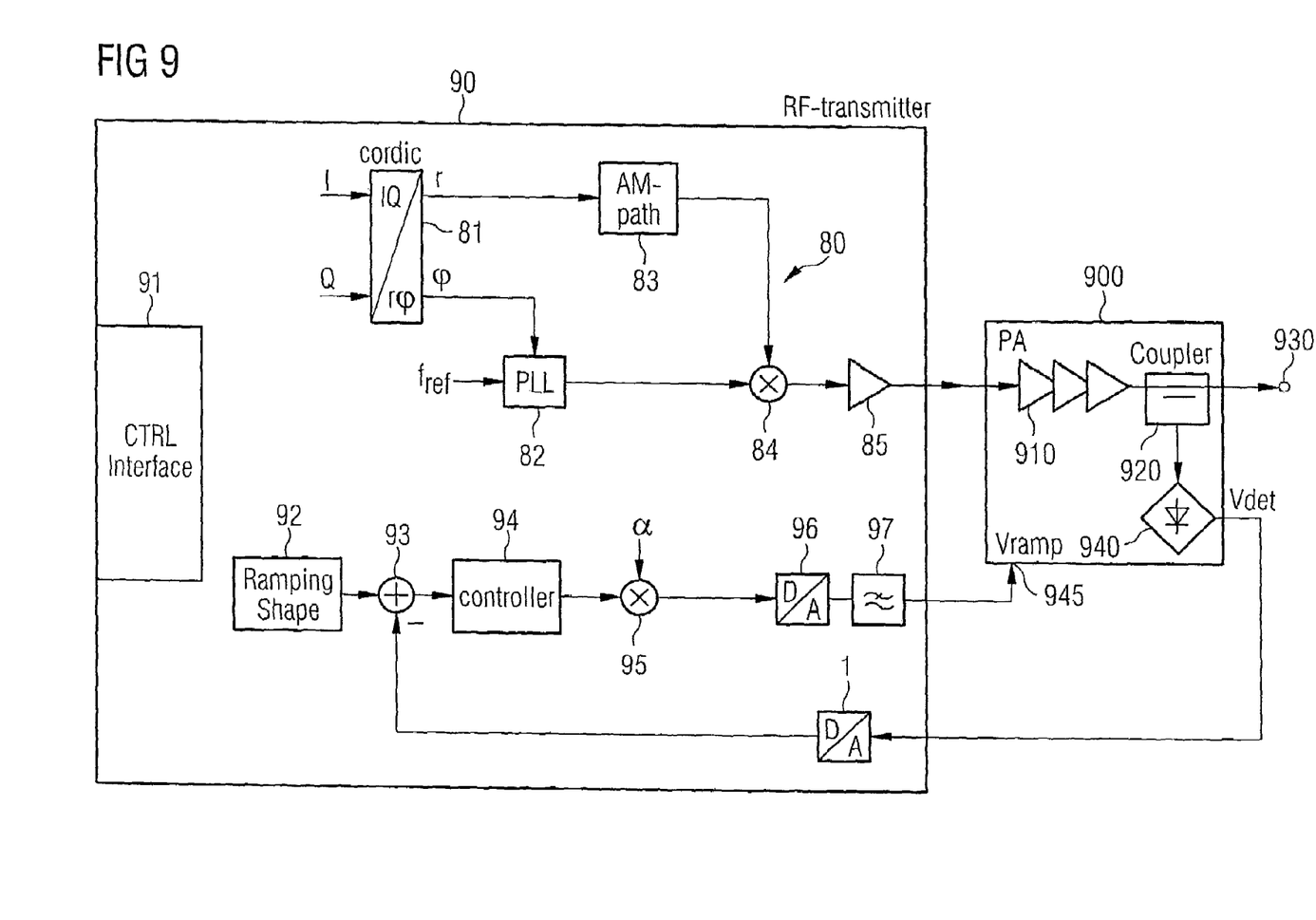
FIG. 9 shows a first embodiment of an RF transmitter with a self-adapting tracking analogue-to-digital converter.

FIG. 9 illustrates an example of an RF transmitter with an automatic control loop capable of achieving the required highly dynamic range. The RF transmitter comprises an RF device 90, connected upstream to a power amplifier device 900. The power amplifier device 900 comprises one or more power amplifiers 910 with selectable amplification gain. The output terminal of the last power amplifier is connected to a bi-directional coupler 920 for providing a signal corresponding to the incident power. The power level is determined by a peak envelope detector 940, which provides a corresponding analogue signal Vdet. The output of the coupler 920 is applied to terminal 930, which may be coupled to an antenna not shown herein.

The RF unit 90 comprises the automatic gain control loop as well as various circuits for RF modulation. The data to be transmitted are applied as digital base band I and Q signals and converted into a polar representation via a cordic transformer 81. The polar representation comprises a phase portion φ and an amplitude portion r. The phase portion φ is applied to a phase locked loop 82, thereby generating a phase modulated signal on the desired RF frequency. The amplitude portion r is applied to an amplitude modulation path 83, which may comprise different filters, interpolators, some power control elements and the like.

A mixer 84 is connected with its first input to the phase locked loop 82 and with a second input to the amplitude modulation path 83. The mixer 84 mixes the preprocessed amplitude portion with the already phase modulated RF signal and provides the amplitude and phase modulated signal to a first output amplifier 85.

For the power ramping as well as the automatic output power control, a self-adapting fast tracking analogue-to-digital converter of one of the embodiments according to FIG. 1 to 3 is provided, connected with its input terminal to the power detector 940. The digital-to-analogue converter 1 provides a digital data word having different resolution in response to the level of the analogue signal Vdet. The data word is applied to an adder 93, subtracting the data word from a word stored in the ramping RAM 92. The difference between the data word from the ramping RAM 92 and the data word from the digital-to-analogue converter 1 is applied to a controller 94. The output of the controller 94 is connected to a multiplier 95 scaling the output word of the controller by a factor α. The output of the multiplier 95 is coupled to a digital-to-analogue converter. The converted analogue signal is filtered by the low-pass filter 97 and applied to a terminal 945 of the power amplifier device 900 as an analogue signal Vramp. The digital signal processing in the power control loop results in a higher accuracy and more independency with respect to external parameters like, for example, temperature or process variations. The power controller 94 can be realized as a single digital integrator or, alternatively, as a proportional and integrator controller.

Figure 10:
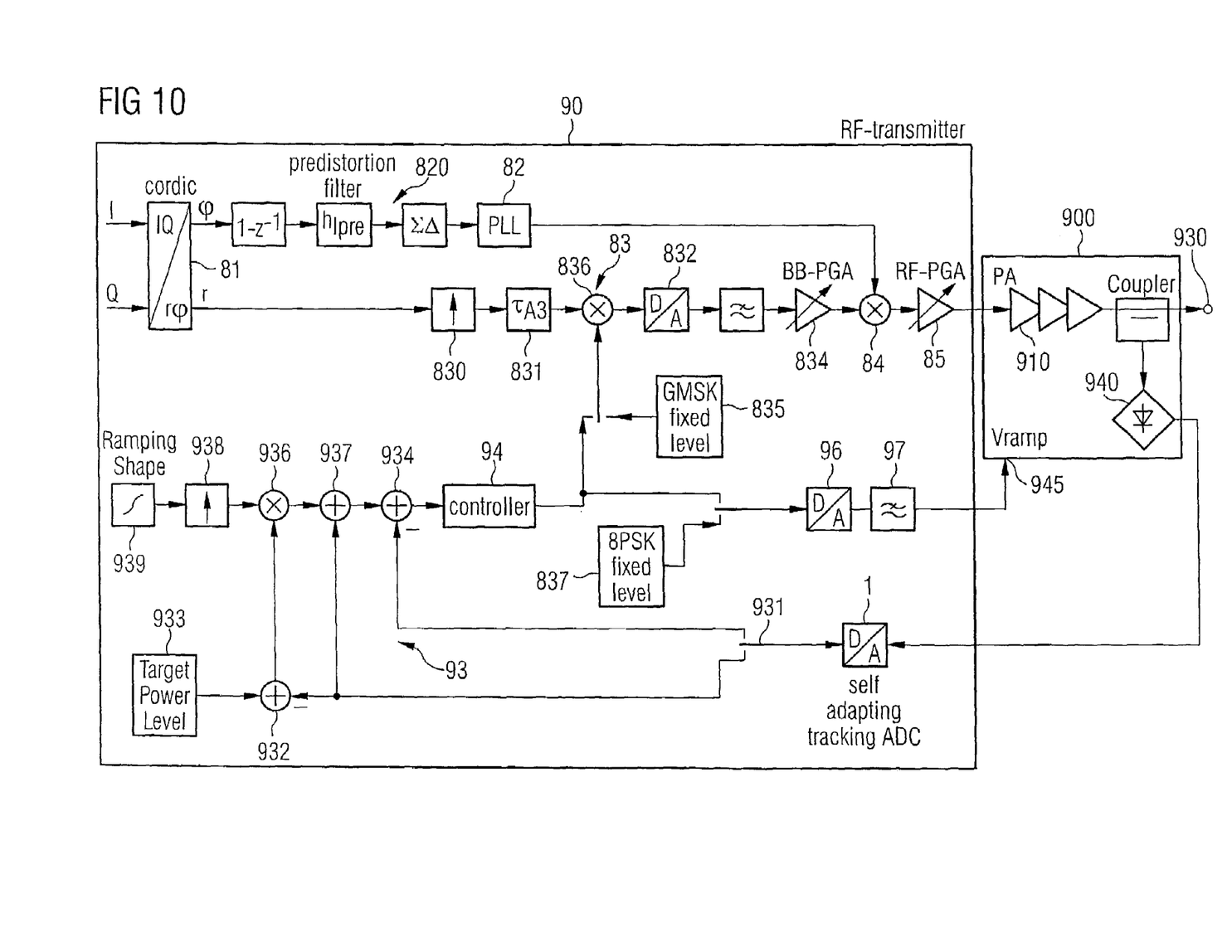
FIG. 10 illustrates a second embodiment of an RF transmitter with a self-adapting tracking analogue-to-digital converter.

FIG. 10 illustrates a further embodiment of an RF transmitter used for the GSM and EDGE mobile communication standards. The RF unit 90 of the RF transmitter comprises a polar modulator with a first signal path for the amplitude portion r and a second signal path for the phase portion φ. The cordic transformer 81 receives the digital I and Q signals and converts them into a digital amplitude portion r and a corresponding digital phase portion φ. The phase portion φ is applied to a pre-distortion filter 820 comprising some digital filters and a ΣΔ-modulator. The ΣΔ-modulator converts the filtered and pre-processed digital phase portion into an analogue signal. The analogue phase portion is applied to a phase locked loop 82 for phase and frequency modulation of the corresponding RF carrier signal.

The output of the cordic 81 for the amplitude portion r is connected to an interpolator 830 and a digital filter 831. The output of the filter 831 is coupled to a digital multiplier, connected downstream to a digital-to-analogue converter 832. The converted analogue amplitude portion is low-pass filtered and applied to a base band programmable amplifier 834. The output of the amplifier 834 is connected to the mixer 84. The chain of the interpolator 830 to the amplifier 834 corresponds to the amplitude modulation path 83.

The base band programmable amplifier 834 as well as the programmable RF amplifier 85 is used to compensate, for example, the attenuation of the amplitude portion r or the analogue RF output signal.

The power control loop comprises the self-adapting tracking analogue-to-digital converter 1, its output connected to a first switch 931. Depending on the operation mode, the output of the self-adapting tracking analogue-to-digital converter 1 is applied to a first adder 932 or a second adder 934. On the one hand, the data word of the analogue-to-digital converter 1 is subtracted from a target power level provided by the memory 933 in the adder 932 and applied to a multiplier 936. The second input of the multiplier 936 is connected to an interpolator 938 coupled to a second memory 939 in which the ramping shape values are stored. The output of the multiplier 936 is connected to the controller 94 via a first adder 937 and a second adder 934. On the other hand, the data word of the analogue-to-digital converter 1 is applied directly to the element 934, subtracting the data word form the data word provided at the other input of element 934.

The output of controller 94 is applied to two switches. One switch is coupling the controller 94 with the digital-to-analogue converter 96. The other switch is connected to the multiplier 836 of the amplitude modulation path 83. During the power ramp-up and power ramp-down function, both switches connect the controller 94 with the input of the digital-to-analogue converter 96 or the multiplier 836. Depending on the mobile communication standard chosen for actual data transmission, the switches may also connect either the unit 835 or the unit 837 to the respective circuits 836 or 96. More particularly, if the GSM mobile communication standard is selected, the device 835 comprising a memory for GSM fixed levels is coupled to the multiplier 836.

At the same time, the controller 94 is still coupled with the input of the digital-to-analogue converter 96 for power control. If the telecommunication standard EDGE is chosen, using an 8PSK modulation type, the device 837 with the memory storing the required EDGE power levels is connected to the digital-to-analogue converter 96 for power control during data transmission.

Figure 11:
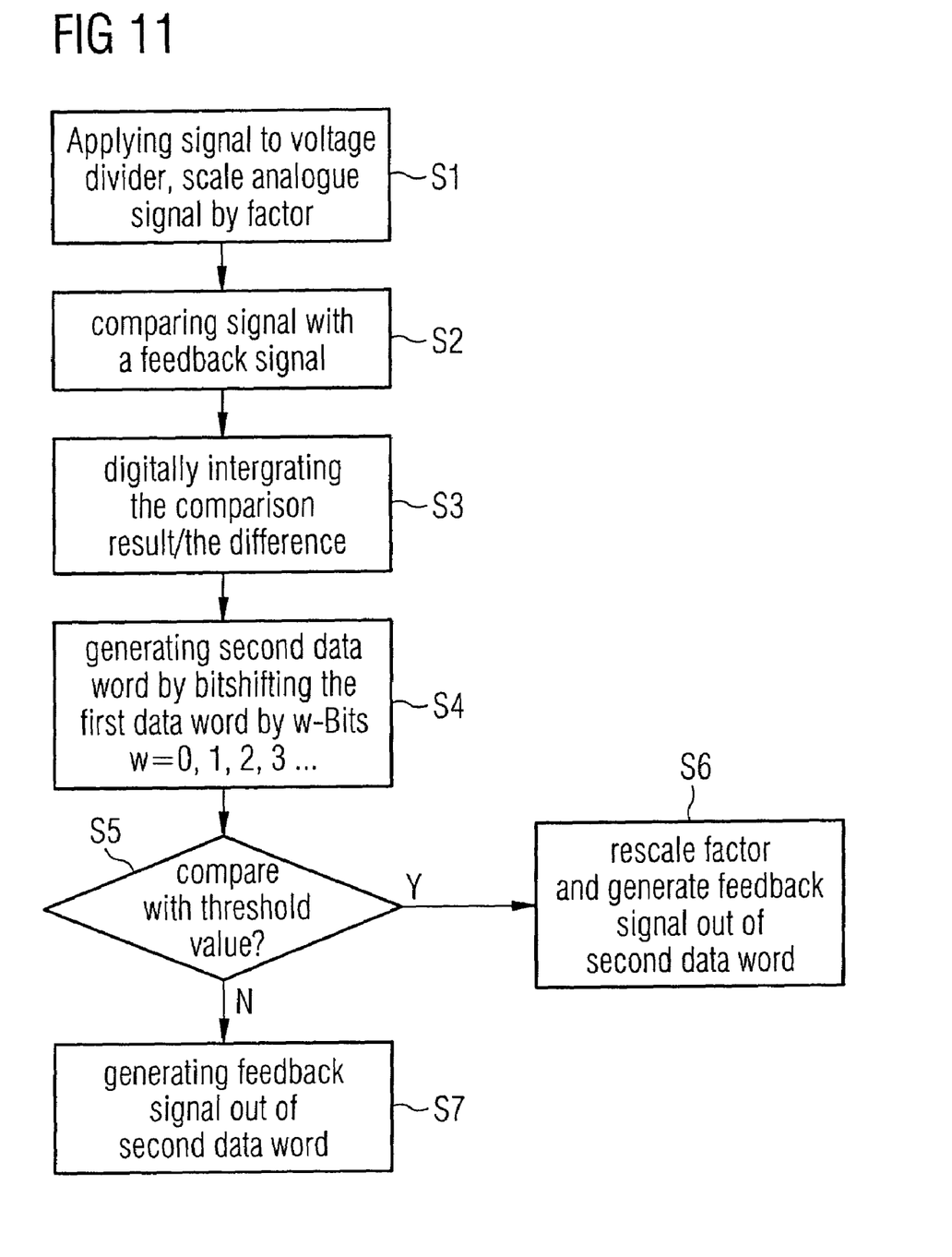
FIG. 11 illustrates an embodiment of a method for converting an analogue signal to a digital data word.

FIG. 11 illustrates an embodiment for a method of converting an analogue signal to a digital data word. While the method and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated actions may be required to implement a methodology in accordance with the invention.

At S1 the analogue signal is applied to a voltage divider and scaled by a factor. The factor can be 1, for instance, which means the analogue signal is not scaled at all. The scaling factor can also be greater than one resulting in an attenuation of the signal by the scaling factor. If the scaling factor is smaller than one, the analogue signal is amplified by the scaling factor.

The divided analogue signal is then compared with a feedback signal at S2. The result of such comparison represents the difference between the divided analogue signal and the feedback signal. This difference signal is digitally integrated at S3 to provide a first data word. And may initially be scaled by a factor, for example, an inverse of the factor employed at S1. The first data word may comprise a first word length having a number of bits.

At S4 a second data word is generated out of the first data word. For instance the first data word is divided by a scaling factor, thereby reducing the word length of the data word to provide the second data word. The scaling factor may be the same as the scaling factor used in step S1. It is also possible to simply extract N bits out of the first data word, those N bits representing the second data word. For instance the first N least or most significant bits of the first data word can be taken, neglecting the other bits. Yet another possibility is to neglect some bits of the first data word and take the others for the second data word. It is also possible to perform a bit-operation on the first data word, for example a left or right bit shift.

At S5, the first data word or the second data word is compared with at least one threshold value. Some hysteresis can be added in one embodiment to prevent an undesired switching between the different scaling factors due to small distortion effects or variations of the first data word or the analogue signal. Depending on the comparison the factor for the voltage division at S1 is changed. For instance if the second data word rises above the threshold values, a smaller resolution shall be selected. For this purpose, a new and bigger scaling factor is selected and the divider adjusted appropriately. At the same time the scaling factor at S4 is adjusted accordingly. For instance, other bits are now extracted from the first data word to provide the second data word. Bit shifting may be changed as well. It is also possible to neglect now a further bit of the most or least significant bit.

By changing the scaling factor of the voltage divider and the scaling factor of the scaling at S4 accordingly, the feedback signal will change in the same manner as the divided analogue signal. Consequently the first data word provided during digital integration will remain unaffected by the scaling factor change.

The different elements and devices in the various embodiments disclosed herein can be combined without departing from the scope of the present invention. As known to a person skilled in the art, the self-adapting tracking ADC can be used in RF transmitters not only for a power control loop but also in other circuit blocks of the transmitter. Further, the transmitter shown herein can be modified in different ways to be adopted for transmission of signals according to other communication standards. The different devices and circuits can be replaced or modified to be adjusted onto various requirements and applications. The scope of the invention should, therefore, be determined with reference to the appended claims along with the scope of equivalence to which such claims are entitled.

It is emphasized that the abstract is provided to comply with 37cfr. section 1.72(b) requiring an abstract that will allow the reader to quickly ascertain the nature and gist of a technical disclosure. It is submitted with the understanding that it will not be used to interpret or limit the scope of meaning of the claims.

The invention claimed is:

1. A tracking analog to digital converter, comprising:
a feed forward path comprising a comparator and a digital integrator coupled thereto configured to provide a first data word in response to the comparator's output signal;
a feedback path comprising a digital to analog converter comprising an output coupled to a first input of the comparator;
a voltage divider comprising a divider ratio that is selectable in response to a first selection signal, wherein the voltage divider is coupled upstream to a second input of the comparator;
a scaling device connected to an output of the digital integrator, and configured to provide a second data word to the feedback path, wherein the second data word is derived from the first data word in response to a scaling ratio selected by a second selection signal; and
a control circuit configured to provide the first and second selection signal in response to the first data word or the second data word.

2. The tracking analog to digital converter of claim 1, wherein the scaling device comprises a multiplier with a selectable multiplication factor.

3. The tracking analog to digital converter of claim 1, wherein the scaling device comprises a bit shifting circuit configured to provide the second data word by shifting the first data word by a number of bits.

4. The tracking analog to digital converter of claim 1, wherein the scaling unit comprises a multiplexer having a first input terminal and at least a second input terminal, wherein the first terminal is coupled to the output of the digital integrator.

5. The tracking analog to digital converter of claim 4, wherein the scaling unit comprises at least one bit shifting circuit connected to the at least one second input terminal.

6. The tracking analog to digital converter of claim 1, wherein the scaling unit is configured to provide the second data word with a reduced word length with respect to a word length of the first data word.

7. The tracking analog to digital converter of claim 1, wherein the first selection signal and the second selection signal are the same selection signal.

8. The tracking analog to digital converter of claim 1, wherein the feed forward path comprises a step compensator unit disposed between the output of the comparator and the input of the digital integrator, the step compensator configured to provide the comparator results with a selectable multiplication factor.

9. The tracking analog to digital converter of claim 8, wherein the step compensator unit comprises a control input terminal coupled to the control circuit.

10. The tracking analog to digital converter of claim 1, wherein the control circuit comprises a first comparator configured to provide the selection signal in response to a comparison of the first or the second data word with a first threshold value.

11. The tracking analog to digital converter of claim 10, wherein the control circuit comprises a second comparator configured to provide the selection signal in response to a comparison of the first or the second data word with a second threshold value.

12. The tracking analog to digital converter of claim 1, wherein the voltage divider comprises one or a plurality of selectable resistors.

13. A tracking analog to digital converter, comprising:
a digital integrator configured to provide a first data word with a first word length;
a scaling device coupled to the digital integrator, and configured to provide a second data word having a reduced second word length with respect to the first word length, wherein the second data word is derived from the first data word in response to a selection signal;
a digital to analog converter configured to provide an analogue signal derived from the second data word;
a voltage divider comprising a selectable divider ratio, wherein the divider ratio is selected in response to the selection signal, and configured to divide an input analog signal by the divider ratio;
a comparator configured to provide a difference result signal, the comparator coupled with its inputs to the voltage divider and to the digital to analog converter, respectively, and with its output coupled to the digital integrator; and
a control circuit configured to provide the selection signal in response to the first or second data word.

14. The tracking analog to digital converter of claim 13, wherein the scaling device comprises a multiplier with a selectable multiplication factor.

15. The tracking analog to digital converter of claim 13, wherein the scaling device comprises a bit shifting circuit configured to generate the second data word by shifting the first data word by a number of bits.

16. The tracking analog to digital converter of claim 13, wherein the scaling unit comprises:
a multiplexer having a first input terminal and at least a second input terminal, wherein the first terminal is coupled to the output of the digital integrator; and
at least one bit shifting circuit is connected to the at least one second input terminal.

17. The tracking analog to digital converter of claim 13, wherein the control circuit comprises a first comparator configured to compare the first or second data word with a first threshold value and a second comparator configured to compare the first or second data word with a second threshold value, wherein the control circuit is configured to provide the selection signal in response to the comparison results of the first and second comparator.

18. The tracking analog to digital converter of claim 13, wherein the voltage divider comprises one or a plurality of selectable resistors.

19. The tracking analog to digital converter of claim 13, further comprising a step compensator unit coupled between the comparator and the digital integrator, wherein the step compensator is configured to provide an output signal derived from the comparator's result and a multiplication factor in response to the selection signal at a control input.

20. The tracking analog to digital converter of claim 19, wherein the step compensator comprises a multiplexer configured to select one factor out of at least two multiplication factors in response to the selection signal.

21. A transmitter, comprising:
a first signal path configured to provide a modulated RF-signal;
at least one power amplifier with a selectable amplification gain coupled to the first signal path;
a power control loop coupled to the at least one power amplifier configured to receive a signal indicating the power of the RF signal and provide a power control signal to the at least one amplifier in response to the signal, wherein the power control loop comprises a tracking analog to digital converter comprising:
a digital integrator configured to provide a first data word with a first word length;
a scaling device coupled to the digital integrator, and configured to provide a second data word having a reduced second word length with respect to the first word length, wherein the second data word is derived from the first data word in response to a selection signal;
a digital to analog converter configured to provide an analogue signal derived from the second data word;
a voltage divider comprising a selectable divider ratio that is selected in response to the selection signal;
a comparator configured to provide a difference result signal coupled with its inputs to the voltage divider and the digital to analog converter, respectively, and with its output coupled to the digital integrator; and
a control circuit configured to provide the selection signal in response to the first or second data word.

22. The transmitter of claim 21, wherein the first signal path comprises a polar modulator, a polar transmitter, or an I/Q-modulator.

23. The transmitter of claim 21, wherein the first signal path comprises a cordic converter configured to convert a first digital signal component and a second digital signal component into a third digital signal and a fourth digital signal, respectively, wherein the third digital signal represents an amplitude portion and the fourth digital represents a phase portion.

24. The transmitter of claim 21, wherein the power control loop comprises a memory configured to store values representing a power ramp therein.

25. The transmitter of claim 21, wherein the power control loop further comprises a control circuit coupled to the tracking analog to digital converter, and configured to provide the power control signal in response to the first data word and digital values stored in a memory device.

26. The transmitter of claim 21, wherein the scaling device comprises a multiplier with a selectable multiplication factor.

27. The transmitter of claim 21, wherein the scaling device comprises a bit shifting circuit configured to provide the second data word by shifting the first data word by a number of bits.

28. The transmitter of claim 21, wherein the scaling unit comprises:

a multiplexer having a first input terminal and at least a second input terminal, wherein the first terminal is coupled to the output of the digital integrator; and at least one bit shifting circuit connected to the at least one second input terminal.

29. The transmitter of claim 21, wherein the control circuit comprises a first comparator configured to compare the first or the second data word with a first threshold value and a second comparator to compare the first or the second data word with a second threshold value, wherein the control circuit is configured to provide the selection signal in response to the comparison results of the first and second comparator.

30. The transmitter of claim 21, wherein the voltage divider comprises one or a plurality of selectable resistors.

31. The transmitter of claim 21, wherein the digital to analog converter comprises a step compensator coupled between the comparator and the digital integrator, and configured to provide a signal to the digital integrator derived from the comparator's output signal and a multiplication factor, wherein the multiplication factor is selected in response to the selection signal.

32. A method for converting an analog signal into a digital data word, comprising:

dividing an analogue signal by a scaling factor;

comparing the divided analogue input signal with a feedback signal and generating a result signal;

digitally integrating the result signal to provide a first data word with a first word length;

generating a second data word having a reduced second word length with respect to the first word length, wherein the second data word is derived from the first data word and the scaling factor;

comparing the first data word or the second data word with a first threshold value; and changing the scaling factor in response to the comparison result;

wherein comparing the first data word or the second data word further comprises comparing the first data word or the second data word with a second threshold value.

33. The method of claim 32, wherein generating the second data word comprises bit shifting the first data word by a number of bits.

34. The method of claim 32, wherein generating the second data word comprises digital to analog converting the second data word to provide the feedback signal.

35. The method of claim 32, wherein generating a result signal further comprises multiplying the result signal with a multiplication factor based on the scaling factor.

36. The method of claim 35, wherein the scaling factor comprises a value reciprocal to a value representing the multiplication factor.

* * * * *